(12) United States Patent
Biondi et al.

(10) Patent No.: US 7,788,611 B2
(45) Date of Patent: Aug. 31, 2010

(54) METHOD FOR MODELING LARGE-AREA TRANSISTOR DEVICES, AND COMPUTER PROGRAM PRODUCT THEREFOR

(75) Inventors: Tonio Gaetano Biondi, Catania (IT); Giuseppe Greco, Acireale (IT); Salvatore Rinaudo, San Marco d'Alunzio (IT); Gaetano Bazzano, Floridia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 334 days.

(21) Appl. No.: 11/770,578

(22) Filed: Jun. 28, 2007

(65) Prior Publication Data

US 2008/0022246 A1 Jan. 24, 2008

Related U.S. Application Data

(60) Provisional application No. 60/817,465, filed on Jun. 29, 2006.

(51) Int. Cl.
*G06F 17/50* (2006.01)
(52) U.S. Cl. .............................................. 716/4; 716/2
(58) Field of Classification Search ................. 716/1–2, 716/4, 8
See application file for complete search history.

(56) References Cited

U.S. PATENT DOCUMENTS

| | | | | |
|---|---|---|---|---|
| 5,278,770 A * | 1/1994 | Gore et al. | ..................... | 703/14 |
| 5,648,920 A * | 7/1997 | Duvvury et al. | ................ | 716/20 |
| 6,631,505 B2 * | 10/2003 | Arai | ................ | 716/4 |
| 7,051,293 B1 * | 5/2006 | Teig et al. | ....................... | 716/1 |
| 7,139,990 B2 * | 11/2006 | Singh et al. | ..................... | 716/5 |
| 7,219,045 B1 * | 5/2007 | Wu et al. | ........................ | 703/14 |
| 7,269,810 B1 * | 9/2007 | Weller et al. | .................... | 716/5 |
| 7,343,571 B2 * | 3/2008 | Miura et al. | .................... | 716/4 |
| 7,480,604 B2 * | 1/2009 | Bianchi | ....................... | 703/14 |
| 7,542,891 B2 * | 6/2009 | Lin et al. | ....................... | 703/14 |
| 2005/0114806 A1 * | 5/2005 | Gasparik et al. | ................ | 716/5 |
| 2005/0120315 A1 * | 6/2005 | Miura et al. | .................... | 716/4 |
| 2005/0216873 A1 * | 9/2005 | Singh et al. | ..................... | 716/5 |
| 2006/0107246 A1 * | 5/2006 | Nakamura | ....................... | 716/5 |
| 2006/0150132 A1 * | 7/2006 | Gupta | ............................ | 716/5 |
| 2007/0028195 A1 * | 2/2007 | Chidambarrao et al. | ......... | 716/2 |
| 2007/0094623 A1 * | 4/2007 | Chen et al. | ..................... | 716/4 |
| 2009/0055152 A1 * | 2/2009 | Bianchi | ....................... | 703/14 |

OTHER PUBLICATIONS

Scott et al., "An Accurate Model for Power DMOSFET's Including Interelectrode Capacitances," Proc. IEEE Power Electronics Conf., pp. 113-119, 1990.

Shenai, "A Circuit Simulation Model for High-Frequency Power MOSFET's," IEEE Trans. Power Electronics 6(3): 539-547, Jul. 1991.

(Continued)

*Primary Examiner*—Stacy A Whitmore
(74) *Attorney, Agent, or Firm*—Lisa K. Jorgenson; E. Russell Tarleton; Seed IP Law Group PLLC

(57) ABSTRACT

A method models the electrical characteristics of wide-channel transistors, such as power transistors, by generating a lumped-element distributed circuit model. More specifically, the active area of the transistor is organized in elementary transistor cells, which are substituted by active lumped elements. Similarly the passive area of the transistor is organized in elementary strip-lines, which are substituted by passive lumped elements. Preferably, the parameters of the lumped elements are extracted automatically from layout information, such as path dimensions, and technological data, such as sheet resistance of the metal layers, sheet resistance of the polysilicon layers and oxide thickness.

28 Claims, 3 Drawing Sheets

OTHER PUBLICATIONS

Wunderlich et al., "Modeling the Gate More Accurately for Power MOSFETs," IEEE Trans. Power Electronics 9(1): 105-111, Jan. 1994.

Tsividis et al., "MOSFET Modeling for Analog Circuit CAD Problems and Prospects," IEEE J. Solid-State Circuits 29: 210-216, Mar. 1994.

Budihardjo et al., "The Lumped-Charge Power MOSFET Model, Including Parameter Extraction," IEEE Trans. Power Electronics 10(3): 379-387, May 1995.

Daniel et al., "Modeling of the CoolMOS Transistor-Part II: DC Model and Parameter Extraction," IEEE Trans. Electron Devices 49(5): 923-929, May 2002.

Aubard et al., "Power MOSFET Switching Waveforms: An Empirical Model Based on a Physical Analysis of Charge Locations," Proc. IEEE Power Electronics Specialists Conf., pp. 1305-1310, 2002.

Schroder et al., "Multi-cell Circuit Model for High-Power Thyristor-Type Semiconductor Devices," IEEE Trans. Industry Applications 39: 1641-1647, Nov./Dec. 2003.

Schroder et al., "Physically Based Models of High Power Semiconductors Including Transient Thermal Behavior," IEEE Trans. Power Electronics 18(1): 231-235, Jan. 2003.

Kraus et al., "Status and Trends of Power Semiconductor Device Models for Circuit Simulation," IEEE Trans. Power Electronics 13(3): 452-465, May 1998.

Budihardjo et al., "Performance Requirements of Power MOSFET Models," IEEE Trans. Power Electronics 12(1): 36-45, Jan. 1997.

Budihardjo et al., "The Lumped-Charge Power MOSFET Model, Including Parameter Extraction," IEEE Trans. Power Electronics 10(3): 379-387, May 1995.

Ong et al., "A Mathematical Model for Power MOSFET Capacitances," Proc. IEEE Power Electronics Specialists Conf., pp. 421-429, 1991.

Vijayalakshmi et al., "Charge-Control Modeling of Power Bipolar Junction Transistors," IEEE Trans. Power Electronics 15(6): 1072-1080, Nov. 2000.

Musumeci et al., "Characterization, Parameter Identification and Modeling of a New Monolithic Emitter-Switching Bipolar Transistor," Proc. IEEE Industry Application Conf., pp. 1924-1931, 2004.

Pagano, "Characterization, Parameter Identification and Modeling of a New Monolithic Emitter-Switching Bipolar Transistor," IEEE Trans. Electron Devices 53(5):1235-1244, May 2006.

Iannuzzo et al., "Physical CAD Model for High-Voltage IGBTs Based on Lumped-Charge Approach," IEEE Trans. Power Electronics 19(4): 885-893, Jul. 2004.

Kang et al., "Parameter Extraction for a Physics-Based Circuit Simulator IGBT Model," Proc. Applied Power Electronics Conf., pp. 946-952, 2003.

Sheng et al., "A Review of IGBT Models," IEEE Trans. Power Electronics 15(6): 1250-1266, Nov. 2000.

Githiari et al., "A Comparison of IGBT Models for use in Circuit Design," IEEE Trans. Power Electronics 14(4): 607-614, Jul. 1999.

Speciale et al., "A Compact Model for Multiterminal Bipolar Devices Used in Smart Power Applications," IEEE Trans. Electron Devices 45(9): 2037-2046, Sep. 1998.

Balachandran et al., "Gummel-Poon Model for 1.8kV SiC High-Voltage Bipolar Junction Transistor," Proc. IEEE Power Electronics Specialists Conf., pp. 2994-2998, 2004.

Chen et al., "A Resonant MOSFET Gate Driver With Efficient Energy Recovery," IEEE Trans. Power Electronics 19(2): 470-477, Mar. 2004.

Krishna et al., "Active Gate Control of Series Connected IGBTs Using Positive Current Feedback Technique," IEEE Trans. Circuits Syst. -II: Express Briefs 52(5): 261-265, May 2005.

Dulau et al., "A New Gate Driver Integrated Circuit for IGBT Devices With Advanced Protections," IEEE Trans. Power Electronics 21(1): 38-44, Jan. 2006.

Lee et al., "Resonant Pole Inverter to Drive the Data Electrodes of AC Plasma Display Panel," IEEE Trans. Industrial Electronics 50(3): 554-559, Jun. 2003.

Van de Sype et al., "Gate-Drive Circuit for Zero-Voltage-Switching Half-and Full-Bridge Converters," IEEE Trans. Industry Applications 38(5): 1380-1388, Sep./Oct. 2002.

Raciti et al., "Control of the Switching Transients of IGBTs Series Strings by High-Performance Drive Units," IEEE Trans. Industrial Electronics 48: 482-490, Jun. 2001.

Mitova et al., "Fully Integrated Gate Drive Supply Around Power Switches," IEEE Trans. Power Electronics 20(3): 650-659, May 2005.

Shenai, "Gate-Resistance-Limited Switching Frequencies of Power MOSFET's," IEEE Electron Device Letters 11(11): 544-546, Nov. 1990.

Khemka et al., "Detection and Optimization of Temperature Distribution Across Large-Area Power MOSFETs to Improve Energy Capability," IEEE Trans. Electron Devices 51(6): 1025-1032, Jun. 2004.

Khemka et al., "Experimental and Theoretical Analysis of Energy Capability of RESURF LDMOSFETs and Its Correlation With Static Electrical Safe Operating Area (SOA)," IEEE Trans. Electron Devices 49(6): 1049-1058, Jun. 2002.

Consoli et al., "Thermal Instability of Low Voltage Power-MOSFETs," IEEE Trans. Power Electronics 15: 575-581, May 2000.

Shenai, "Accurate Characterization of Gate Resistance and High-Frequency Switching Efficiency of a Power MOSFET," Proc. IEEE Power Electronics Specialists Conf., pp. 107-112, 1990.

Busatto et al., "Reverse Bias Instabilities in Bipolar Power Transistors With Cellular Layout," IEEE Trans. Electron Devices 48(11): 2544-2550, Nov. 2001.

Ammous et al., "Transient Temperature Measurements and Modeling of IGBT's Under Short Circuit," IEEE Trans. Power Electronics 13(1): 12-25, Jan. 1998.

Trivedi et al., "Turn-Off Failure of IGBTs Under Clamped Inductive Load," Proc. IEEE Electronics Specialists Conf., pp. 1191-1195, 1998.

Irace et al., "On the Safe Operating Area of power Schottky diodes in avalanche conditions," Proc. IEEE Int. Symp. Power Semicon. Devices ICs, pp. 223-226, May 2005.

Spirito et al., "Thermal Instabilities in High Current Power MOS Devices: Experimental Evidence, Electro-thermal Simulations and Analytical Modeling," Proc. Int. Conf. Microelectronics, pp. 23-30, May 2002.

Turlington, "Behavioral Modeling of Nonlinear RF and Microwave Devices," Artech House Inc., Norwood, MA, 2000, pp. 49-84.

Litwin, "Overlooked Interfacial Silicide-Polysilicon Gate Resistance in MOS Transistors," IEEE Trans. Electron Devices 48(9): 2179-2181, Sep. 2001.

Shenai et al., "High-Performance Vertical-Power DMOSFET's with Selectively Silicided Gate and Source Regions," IEEE Trans. Electron Devices Letters 10(4): 153-155, Apr. 1989.

Pfiester et al., "A Cobalt Salicide CMOS Process with TiN-Strapped Polysilicon Gates," IEEE Trans. Electron Devices Letters 12(6): 350-352, Jun. 1991.

Sun et al., "Impact of Nitrogen (N2+) Implantation into Polysilicon Gate on Therma Stability of Cobalt Silicide Formed on Polysilicon Gate," IEEE Trans. Electron Devices 45(9): 1912-1919, Sep. 1998.

Scott et al., "An Accurate Model for Power DMOSFETs Including Interelectrode Capacitances," IEEE Trans. Power Electronics 6(2): 192-198, Apr. 1991.

Schroder et al., "Multi-Cell Circuit for High-Power Thyristor-Type Semiconductor Devices," Industry Applications Conference, 2001. Thirty-Sixth IAS Annual Meeting. Conference Record of the 2001 IEEE 3: 1516-1520, 2001.

Greco et al., "Control of the Switching Transients of IGBTS Series Strings by High Performance Drive Units," 1-17.

Consoli et al., "Thermal Instability of Low Voltage-Power-MOSFETs," Power Electronics Specialists Conference, 1999. PESC 99. 30th Annual IEEE 1: 345-350, 1999.

Tsividis et al., "MOSFET Modeling For Analog Circuit CAD: Problems and Prospects," Custom Integrated Circuits Conference, 1993., Proceedings of the IEEE 1993: 14.1.1 - 14.1.6, 1993.

* cited by examiner

- metal over passive area
- poly-silicon over passive area
- poly-silicon over active area

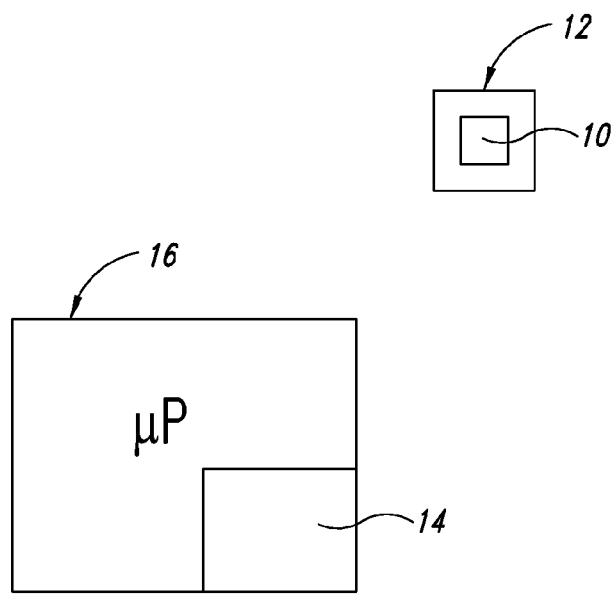
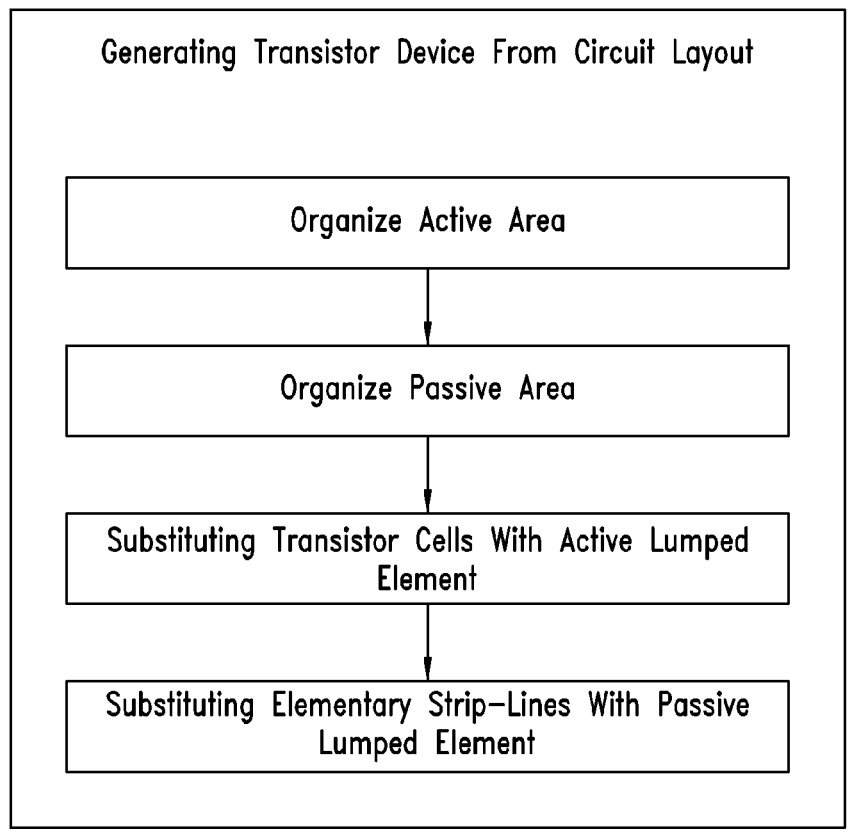
FIG. 6
FIG. 7

METHOD FOR MODELING LARGE-AREA TRANSISTOR DEVICES, AND COMPUTER PROGRAM PRODUCT THEREFOR

CROSS-REFERENCE TO RELATED APPLICATION

This application claims the benefit under 35 U.S.C. §119 (e) of U.S. Provisional Patent Application No. 60/817,465 filed Jun. 29, 2006, application is incorporated herein by reference in its entirety.

BACKGROUND

1. Technical Field

The present invention relates to the design and modeling of large-area transistor devices.

More specifically, the invention has been developed with particular attention being paid to its possible use for modeling layout parasitic effects of large-area silicon power devices.

2. Description of the Related Art

During the last years, many efforts have been made to develop new models for power devices, which improve the degree of accuracy achieved by existing models. Recent advances in this field allowed for describing properly several physical phenomena in power devices, such as carrier velocity saturation and mobility degradation, JFET effect, non-uniform channel doping profile, non-linear charge storage effects, electro-thermal interaction, etc.

In most cases reported in literature, the device is modeled through a lumped circuit that includes compact models and a passive network that empirically takes into account the effects of layout parasitic. Alternatively, model equations for the active part of the device are properly developed from solution of the 1-D or 2-D drift-diffusion problem under simplified assumptions.

Device models generated using the lumped modeling approach are able to reproduce the DC and switching characteristics of power devices, as observed from the external terminals, with a reasonable degree of accuracy. The moderate complexity and good accuracy that characterize lumped models make them suitable for integration in circuit simulation packages for system-level performance analysis. In such cases, end-users of the model are mainly interested in optimizing the performance of the control system by choosing a proper driving circuitry for the power stage rather than improving the performance of the power device itself.

In power devices operating at moderate frequencies, the effect of layout parasites on the device switching characteristics might be safely neglected since the delay experienced by the signal traveling through the polysilicon interconnects is small compared to the rise and fall times of the input.

In this condition, all the elementary transistor cells can be turned on and off almost uniformly, which justifies the use of a lumped modeling approach.

However, the above conditions do not hold any more at higher switching frequencies, as in lighting or high-frequency DC-DC converter applications. In these cases, layout parasitic effects may limit the maximum operating frequency of the device since the time required to reach the farthest elementary transistor cells may be comparable to the switching times of the input signal.

This provides fast switching times for the cells placed close to the input pad but increasing delays for those located farther away. Moreover, the fast turn-off of only a portion of the device forces the remainder to drive a large amount of current during switching. This results in a dramatic current density increase in the slowest parts of the device that is referred to as "hot spots".

This phenomenon is much more pronounced when the device is operated at higher switching frequencies because the current imbalance between the fastest and slowest elementary transistor cells becomes proportionally larger.

Lumped models cannot account for such phenomena, because they derive from the distributed nature of device layout parasitic effects, which are not taken into account in the model itself.

BRIEF SUMMARY

One embodiment of the present invention is a method for modeling electrical characteristics of a wide-channel transistor device. The method includes generating from a circuit layout of said transistor device a lumped-element distributed circuit model. Generating a lumped-element distributed circuit model includes:

organizing an active area of the wide-channel transistor device in elementary transistor cells;

organizing a passive area of the wide-channel transistor device in elementary strip-lines;

substituting each of the elementary transistor cells with an active lumped element; and substituting each of the elementary strip-lines with a passive lumped element.

One embodiment of the invention also relates to a related computer program product, loadable in the memory of at least one computer and including software code portions for performing the steps of the method of the invention when the product is run on a computer. As used herein, reference to such a computer program product is intended to be equivalent to reference to a computer-readable medium containing instructions for controlling a computer system to coordinate the performance of the method of the invention. Reference to "at least one computer" is evidently intended to highlight the possibility for the present invention to be implemented in a distributed/modular fashion.

The claims are an integral part of the disclosure of the invention provided herein.

One embodiment of the present invention relates to the development of a lumped-element distributed modeling methodology for power devices. The proposed methodology exploits the high-frequency modeling approach of microstrips and striplines to describe both the passive parts of the device and the elementary transistor cells. It allows the performance degradation occurring in large-area high-speed devices due to distributed layout parasitic effects to be taken into account at circuit simulation level.

The proposed methodology overcomes the main limitations of the lumped modeling approach employed so far. Indeed, it allows the designer to gain access to the internal characteristics of the power device at circuit simulation level, which is crucial for optimizing its performance during the early design stages.

BRIEF DESCRIPTION OF THE SEVERAL VIEWS OF THE DRAWINGS

The invention will now be described, by way of example only, with reference to the enclosed figures of drawing, wherein:

FIGS. 1(a) to (c) illustrate an exemplary device used to explain the method of the invention, wherein FIG. 1(a) shows a schematic cross-section of an elementary cell of a transistor device, FIG. 1(b) shows a simplified layout and FIG. 1(c) shows a detailed view of the gate structure of the exemplary device, FIG. 6 illustrates components of a system including computer-readable medium for implementing the methods of the present disclosure, and FIG. 7 illustrates a method performed in accordance with one embodiment of the present disclosure.

DETAILED DESCRIPTION

Figure 1:
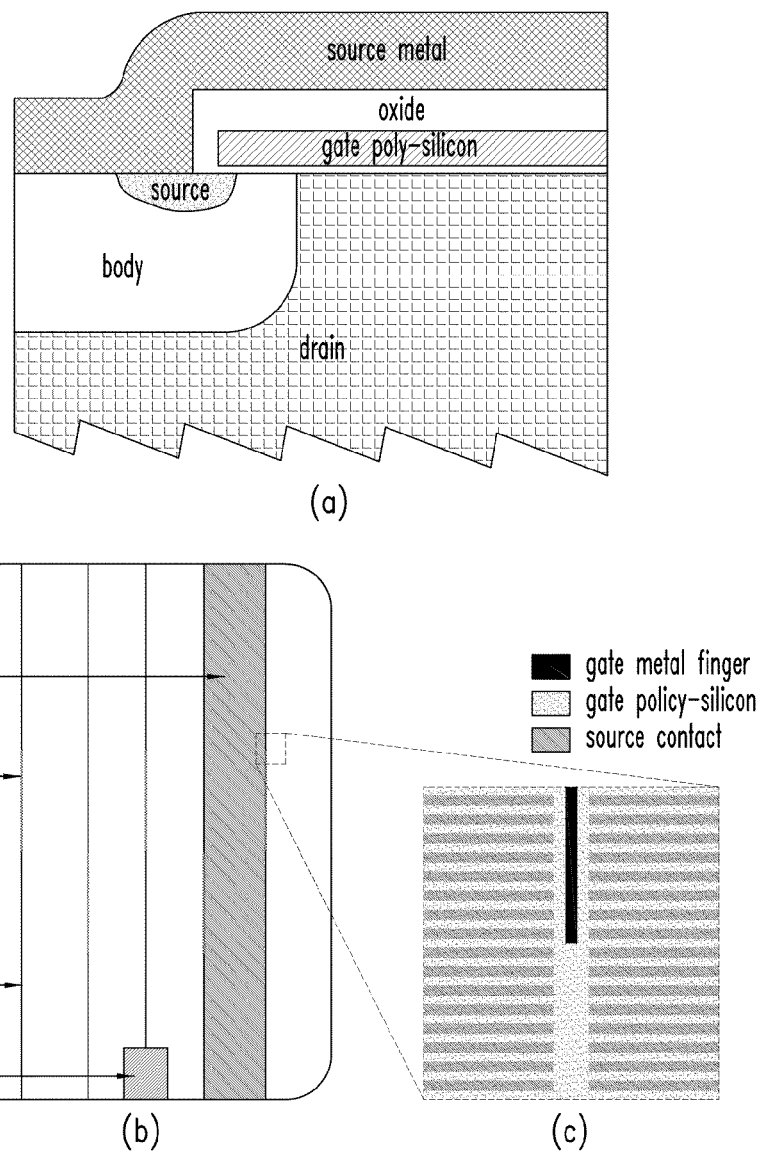

The proposed approach exploits the concepts employed for high-frequency modeling of micro-strips and striplines to describe the electrical characteristics of the metal and polysilicon interconnects of a power device. For this purpose, the information contained in the layout of the power device will be used to generate a lumped-element distributed circuit model that can be employed for circuit simulation.

In the following, a silicon power MOSFET will be employed as a test device to demonstrate the steps involved in the generation of a distributed model.

However, this is not to be construed in a limiting sense of the invention. Indeed, the proposed modeling approach is general and can be easily extended to any other power devices including but not limited to (Power) BJTs, IGBTs, ESBTs, EMSWs (EMitter Switches) etc.

FIG. 1(a) shows a schematic cross-section of an elementary cell of a vertical n-channel MOSFET with the drain contact placed at the bottom of the die.

Fabrication technology exploits one metal layer and one polysilicon layer. The source is short-circuited to the body (via the source metal layer) to avoid the turn-on of the parasitic n-p-n bipolar transistor. Gate interconnects are laid out using the polysilicon layer. Source metal covers almost all the device surface with the only exception of few small regions (namely external gate metal and gate metal fingers, as will be explained in the following) where the metal layer is exploited to create low-resistance gate connections.

In that respect, FIG. 1(b) shows a simplified layout of the device, where die-size is approximately 6300×4200 µm².

The device is made up of several elementary transistor cells connected in parallel in order to achieve the required current handling capability. The region labeled active devices is organized in rows since the polysilicon gate interconnects follow horizontal paths from the external gate metal to each elementary transistor cell.

Indeed, each row is a single wide channel MOSFET that will be treated as a chain of elementary narrow channel MOSFETs for convenience.

Due to the poor conductivity of the polysilicon layer, gate metal fingers are inserted to provide a low resistance path between the gate pad and each elementary transistor cell of the device. These fingers cannot extend from the upper to the lower part of the layout because space has to be left toward the center to allow connection of the source bond wires.

Therefore, some regions of active devices are left without a direct metal connection forming the polysilicon areas. In these areas the gate metal is not present and the elementary transistor cells are only connected through the polysilicon layer. The gate pad, where the gate bond wire is attached, is placed in the lower part of the layout.

From this point, the driving signal propagates throughout the device reaching the elementary transistors via metal and/or polysilicon interconnects.

More specifically, FIG. 1(c) shows a detailed view of the gate structure of the device.

The active area is made up of wide-channel MOSFETs whose gate and source contacts are parallel horizontal strips. The gate signal reaches all the elementary transistor cells of the device passing through the polysilicon layer.

Moving away from the gate metal finger increases the length of the polysilicon path, which provides a higher delay for the gate signal due to the poor conductivity of this layer.

According to one embodiment of the invention, a microstrip approach is employed for creating a distributed model of the gate interconnects in order to account for the above mentioned phenomenon.

Figure 2:
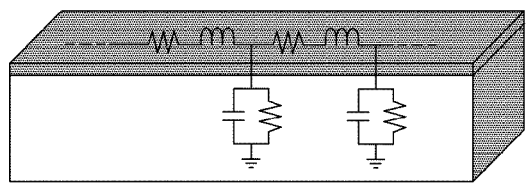
FIG. 2 illustrates a lumped-element distributed model of gate interconnects over passive areas.

In that respect, FIG. 2 shows one embodiment, which models the metal and polysilicon strips over passive areas of the device wherein no source diffusion underneath is considered.

However, this is not to be construed as limitation of the invention since any other circuit could be employed for this task.

The series and parallel parasitic effects are calculated using closed-form expressions that make use of layout information (i.e., path dimensions) and technological data (i.e., sheet resistance of the metal and polysilicon layers and oxide thickness).

Figure 3:
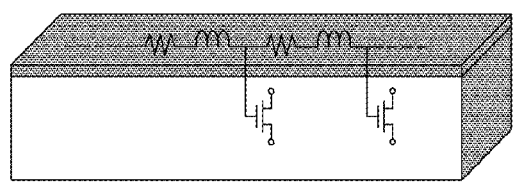
FIG. 3 illustrates a lumped-element distributed model of gate interconnects over active areas.

In FIG. 3 an alternative embodiment is shown wherein the gate interconnects placed over active areas of the device are modeled.

Again, this is not to be construed as limiting the invention since any other circuit could be employed for this task.

More specifically, the parallel capacitance and conductance are substituted by an equivalent circuit model for the elementary transistor cells of the device. A similar approach is employed to model the parasitic effects of the source (emitter in bipolar devices) to account for depolarization of elementary transistor cells.

In case of MOSFET power devices, in a preferred embodiment, the Berkley level 3 MOS model is used in the elementary transistor cells.

The parameters of such model might be obtained e.g. from experimental measurement of devices with scaled layout or device simulations of a per-unit-width elementary transistor cell.

The former approach is expensive since it requires several devices to be fabricated and measured. Additionally, the resulting model may be inaccurate because measured data are affected by instrumentation errors and parasitic effects.

On the other hand, device simulations can be exploited successfully to generate a scaled model of an elementary transistor, as will be shown in the following. This allows the proposed modeling approach to be exploited for pre-silicon analysis and optimization of device performance.

According to one embodiment of the invention the lumped-element distributed model is generated automatically for a given device layout.

Preferably this is accomplished in two steps. In a first step, the circuit layout is translated into a codified structure that is used as input for the generation of the equivalent circuit.

This step is technology independent and uses layout data concerning the position and dimension of the metal and polysilicon interconnects.

The generated structure has the purpose to condense layout information allowing changes to be made very quickly.

This is particularly useful when the proposed modeling approach is employed to optimize the original layout on the basis of circuit simulation results.

In the second step, a lumped-element distributed model is created and its parameters are calculated using layout dimensions and technology data.

Preferably, the resulting netlist is stored in SPICE format, because it can be used as input for several commercial circuit simulators. However, any output file for other circuit simulators might be used.

In a further preferred embodiment, advantage is taken of the hierarchical structure of the SPICE format, which allows for maintaining an equivalent circuit of both the active and passive parts and which can be modified and/or parameterized.

Figure 4:
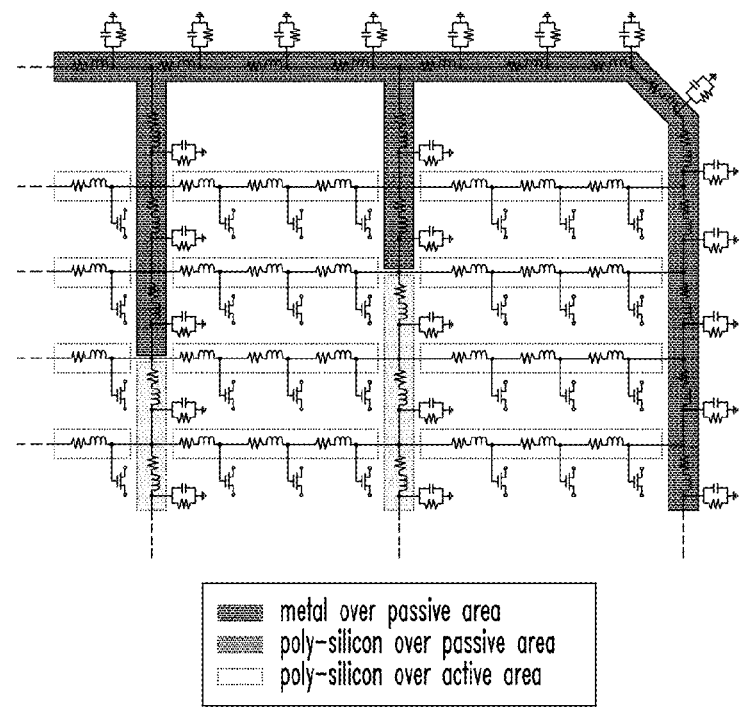
FIG. 4 illustrates a lumped-element distributed model created for the exemplary device.

FIG. 4 shows, by way of example only, a portion (i.e. the upper right corner) of the lumped-element distributed model generated from the layout shown in FIG. 1(b).

More specifically, in the preferred embodiment of the invention, active and passive part of the layout are recognized and substituted with the related sub-circuits as shown e.g. in FIGS. 2 and 3.

Due to the presence of the highly resistive polysilicon areas in the exemplary circuit of FIG. 1, the turn off of the elementary transistor cells placed far away from the gate pad is delayed, which results in a non-uniform current distribution across the device surface.

Therefore based on the lumped-element distributed model, at a given time, the current imbalance within the device can be evaluated by analyzing the current density of each elementary transistor cell of the matrix.

Figure 5:
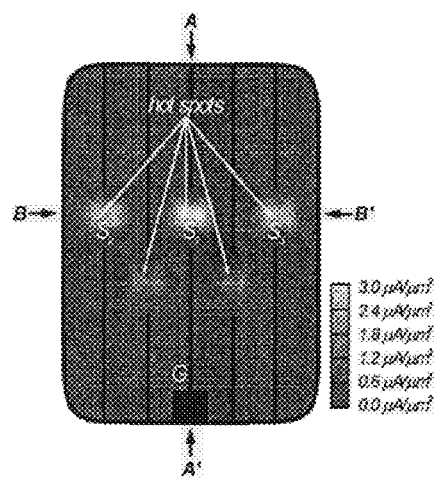
FIG. 5 illustrates the simulated current density distribution of the exemplary device during the turn-off transient.

In that respect, FIG. 5 shows the simulation results, which demonstrate that the maximum current density (i.e. where hot spots occur) appears in the polysilicon areas towards the center of the device.

This leads to the consideration that increasing the conductivity of this layer might provide a good solution for improving device performance and ruggedness at reasonable costs.

The classical lumped modeling approach employed so far does not allow the designer to investigate the internal behavior of the power device. In some cases, this may represent an advantage for semiconductor companies, because the model can be delivered to third parties without transferring any device internal information.

However, when the model is employed by the semiconductor company itself for device development rather than circuit design, the lumped approach proves inefficient because it does not allow the effect of distributed layout parasitic effects and related failure mechanisms to be accounted for.

In the past, these phenomena have only been highlighted by experimental measurements of devices showing inadequate performance or faults. Additionally, measurements are carried out usually on-board after mass-production and packaging of the power device, and a negative outcome may require re-design and fabrication of a whole lot with a huge loss of money for semiconductor companies.

For these reasons, one of the main advantages of the method is that developers gain access to the internal device characteristics through a distributed modeling approach, and which allows for improving device performance already during the development phases, which significantly reduces time-to-market by minimizing the need for re-design.

FIG. 6 illustrates a computer-readable medium 12 having code portions 10 stored thereon that, when loaded into a memory 14 of a computer 16, cause the computer to perform the method of the present disclosure, such as the method illustrated in FIG. 7.

In FIG. 7, one method in accordance with the present disclosure is shown to include a first step of generating from a circuit layout of a transistor device, such as a wide-channel transistor device, a lumped-element distributed circuit model. This includes the following four steps: organizing an active area of the transistor device in elementary transistor cells, organizing a passive area of the transistor device in elementary strip lines, substituting each of the elementary transistor cells with an active lumped-element, and then substituting elementary strip lines with a passive lumped-element.

Consequently, without prejudice to the underlying principles of the invention, the details and the embodiments may vary, even appreciably, with reference to what has been described by way of example only, without departing from the scope of the invention as defined by the annexed claims.

The invention claimed is:

1. A method, comprising:
using a computer to perform the following steps:
modeling electrical characteristics of a transistor device used in a high frequency circuit, comprising:
generating from a circuit layout of said transistor device a lumped-element distributed circuit model, wherein said generating a lumped-element distributed circuit model comprises:
organizing an active area of said transistor device in elementary transistor cells;
organizing a passive area of said transistor device in elementary strip-lines;
substituting each of said elementary transistor cells with an active lumped element; and
substituting each of said elementary strip-lines with a passive lumped element.

2. The method of claim 1, wherein said active lumped element includes at least one transistor element.

3. The method of claim 1, wherein said passive lumped element includes at least one conductive element.

4. The method of claim 1, wherein said passive lumped element includes at least one inductive element.

5. The method of claim 1, wherein said passive lumped element includes at least one capacitive element.

6. The method of claim 1, wherein said transistor device is a power transistor device.

7. The method of claim 1, wherein said active lumped element includes at least one conductive element, said transistor device is a MOSFET transistor, and said transistor device is modeled by the Berkley level 3 MOS model.

8. The method of claim 1, wherein part of said passive area is metal over passive area.

9. The method of claim 1, wherein part of said passive area is polysilicon over passive area.

10. The method of claim 1, wherein part of said active area is polysilicon over active area.

11. The method of claim 1, wherein parameters of said active and said passive elements are extracted from layout information.

12. The method of claim 11, wherein said layout information includes the path dimensions.

13. The method of claim 1, wherein parameters of said active and said passive elements are extracted from technological data.

14. The method of claim 13, wherein said technology data include at least one out of the group of sheet resistance of the metal layers, sheet resistance of the polysilicon layers and oxide thickness.

15. The method of claim 1, comprising:
translating the circuit layout of said transistor device into a codified structure including at least layout data concerning the position and dimension of the metal and polysilicon interconnects;
regenerating said lumped-element distributed circuit model; and
calculating parameters of said lumped-element distributed circuit model from said codified structure and technology data.

16. The method of claim 1, wherein said lumped-element distributed circuit model is stored in a netlist format.

17. The method of claim 16, wherein said netlist format is a SPICE format that uses a hierarchical structure of the SPICE format, and maintains an equivalent circuit of both the active and passive parts.

18. The method of claim 1, further comprising simulating the electrical characteristics of the transistor device on the lumped-element distributed circuit model of said transistor device.

19. A computer-readable medium having code portions that, when loaded into a memory of the computer, cause the computer to perform a method, comprising:
modeling electrical characteristics of a transistor device used in a high frequency circuit by step comprising:
generating from a circuit layout of said transistor device a lumped-element distributed circuit model, wherein said generating a lumped-element distributed circuit model includes:
organizing an active area of said transistor device in elementary transistor cells;
organizing a passive area of said transistor device in elementary strip-lines;
substituting each of said elementary transistor cells with an active lumped element; and
substituting each of said elementary strip-lines with a passive lumped element.

20. The computer-readable medium of claim 19, wherein the method includes:
translating the circuit layout of said transistor device into a codified structure including at least layout data concerning the position and dimension of the metal and polysilicon interconnects;
regenerating said lumped-element distributed circuit model; and
calculating parameters of said lumped-element distributed circuit model from said codified structure and technology data.

21. The computer-readable medium of claim 1, wherein said lumped-element distributed circuit model is stored in a netlist format.

22. The computer-readable medium of claim 21, wherein said netlist format is a SPICE format that uses a hierarchical structure of the SPICE format, and maintains an equivalent circuit of both the active and passive parts.

23. The computer-readable medium of claim 19, wherein the method includes simulating the electrical characteristics of the transistor device on the lumped-element distributed circuit model of said transistor device.

24. A device for modeling electrical characteristics of a transistor device used in a high frequency circuit, comprising:
generating means for generating from a circuit layout of said transistor device a lumped-element distributed circuit model, wherein said generating means includes:
means for organizing an active area of said transistor device in elementary transistor cells;
means for organizing a passive area of said transistor device in elementary strip-lines;
means for substituting each of said elementary transistor cells with an active lumped element; and
means for substituting each of said elementary strip-lines with a passive lumped element.

25. The device of claim 24, comprising:
means for translating the circuit layout of said transistor device into a codified structure including at least layout data concerning the position and dimension of the metal and polysilicon interconnects;
means for regenerating said lumped-element distributed circuit model; and
means for calculating parameters of said lumped-element distributed circuit model from said codified structure and technology data.

26. The device of claim 24, wherein said lumped-element distributed circuit model is stored in a netlist format.

27. The device of claim 26, wherein said netlist format is a SPICE format that uses a hierarchical structure of the SPICE format, and maintains an equivalent circuit of both the active and passive parts.

28. The device of claim 24, further comprising means for simulating the electrical characteristics of the transistor device on the lumped-element distributed circuit model of said transistor device.

* * * * *